United States Patent
Afentakis

(10) Patent No.: US 11,455,052 B2
(45) Date of Patent: Sep. 27, 2022

(54) DETECTION APPARATUS

(71) Applicant: Peratech Holdco Ltd, Richmond (GB)

(72) Inventor: Themistoklis Afentakis, Camas, WA (US)

(73) Assignee: PERATECH HOLDCO LIMITED, North Yorkshire (GB)

( * ) Notice: Subject to any disclaimer, the term of this patent is extended or adjusted under 35 U.S.C. 154(b) by 0 days.

(21) Appl. No.: 16/768,262

(22) PCT Filed: Nov. 28, 2018

(86) PCT No.: PCT/GB2018/000151
§ 371 (c)(1),
(2) Date: May 29, 2020

(87) PCT Pub. No.: WO2019/106327
PCT Pub. Date: Jun. 6, 2019

(65) Prior Publication Data
US 2020/0371633 A1 Nov. 26, 2020

(30) Foreign Application Priority Data

Nov. 29, 2017 (GB) .................. 1719836

(51) Int. Cl.
*G06F 3/041* (2006.01)
*G06F 3/045* (2006.01)
*H03K 17/96* (2006.01)

(52) U.S. Cl.
CPC .......... *G06F 3/0414* (2013.01); *G06F 3/045* (2013.01); *H03K 17/9647* (2013.01)

(58) Field of Classification Search
CPC .... G06F 3/0414; G06F 3/04144; G06F 3/045; G06F 3/04166; H03K 17/9647
USPC .................................... 345/173, 174
See application file for complete search history.

(56) References Cited

U.S. PATENT DOCUMENTS

| 9,524,070 B2 * | 12/2016 | Hwang ................ G01L 5/228 |
| 2010/0079381 A1 | 4/2010 | Hayashi et al. |
| 2011/0006192 A1 * | 1/2011 | Miyazawa ........ H01L 27/14665 250/208.1 |
| 2013/0050126 A1 | 2/2013 | Kimura et al. |

(Continued)

FOREIGN PATENT DOCUMENTS

EP 0919947 A2 6/1999

OTHER PUBLICATIONS

Corresponding International Patent Application No. PCT/GB2018/000151, International Search Report dated Feb. 12, 2019.

(Continued)

*Primary Examiner* — Jimmy H Nguyen
(74) *Attorney, Agent, or Firm* — Cooper Legal Group LLC

(57) ABSTRACT

An apparatus for detecting a mechanical interaction has a plurality of scan lines and a plurality of output lines. An intersection between each scan line and output line provides a connection to a plurality of sensing elements. Each of the sensing elements comprises a variable resistance element and a voltage amplifier. The apparatus includes an output processor which determines a voltage output in parallel at each output line from the plurality of sensing elements on activation of one of the scan lines from a driving processor.

13 Claims, 14 Drawing Sheets

(56) References Cited

U.S. PATENT DOCUMENTS

2013/0265256 A1 10/2013 Nathan et al.
2015/0316958 A1* 11/2015 Takesue ................ G06F 1/1652
  345/173

OTHER PUBLICATIONS

Corresponding International Patent Application No. PCT/GB2018/000151, Written Opinion of the International Searching Authority dated Feb. 12, 2019.

* cited by examiner $$V_{OUT} = V_{SCAN} \frac{R_{302}}{R_{301}+R_{302}+R_{211}}$$

DETECTION APPARATUS

CROSS REFERENCE TO RELATED APPLICATIONS

This application claims priority from United Kingdom Patent Application number GB 17 19 836.7, filed on 29 Nov. 2017, the whole contents of which are incorporated herein by reference.

BACKGROUND OF THE INVENTION

The present invention relates to apparatus for detecting a mechanical interaction, and a method of detecting a mechanical interaction.

Matrix array sensors are known which include a plurality of scan lines which intersect with a plurality of drive lines to define a sensing array. Variably resistive elements can be provided at each intersection of the array, presenting a high resistance at each intersection until a mechanical pressure is applied, whereupon the resistance reduces significantly thereby allowing conduction to take place.

Known sensing arrays have a number of shortcomings which limit the flexibility and use of the sensors. In such arrangements, a current output is measured which provides relatively low current values which are difficult to measure without complex and expensive circuitry. This also means that arrays of this type lack sensitivity in terms of measurements thereby reducing the number of potential applications in which the arrays can be utilized.

Further, in passive sensing arrays, the resistive sensor is connected at the intersection with resistor terminals connected at both the row and the column. This approach is only suitable for small array sizes as larger sizes consequently experience problems with ghosting and non-uniformity.

BRIEF SUMMARY OF THE INVENTION

According to an aspect of the present invention, there is provided an apparatus for detecting a mechanical interaction according to claim 1.

According to a further aspect of the present invention, there is provided a method of detecting a mechanical interaction in a sensing array according to claim 13.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

BRIEF DESCRIPTION OF THE SEVERAL VIEWS OF THE DRAWINGS

The invention will be described by way of example only with reference to the accompanying drawings, of which.

DETAILED DESCRIPTION OF THE INVENTION

FIG. 1

Figure 1:
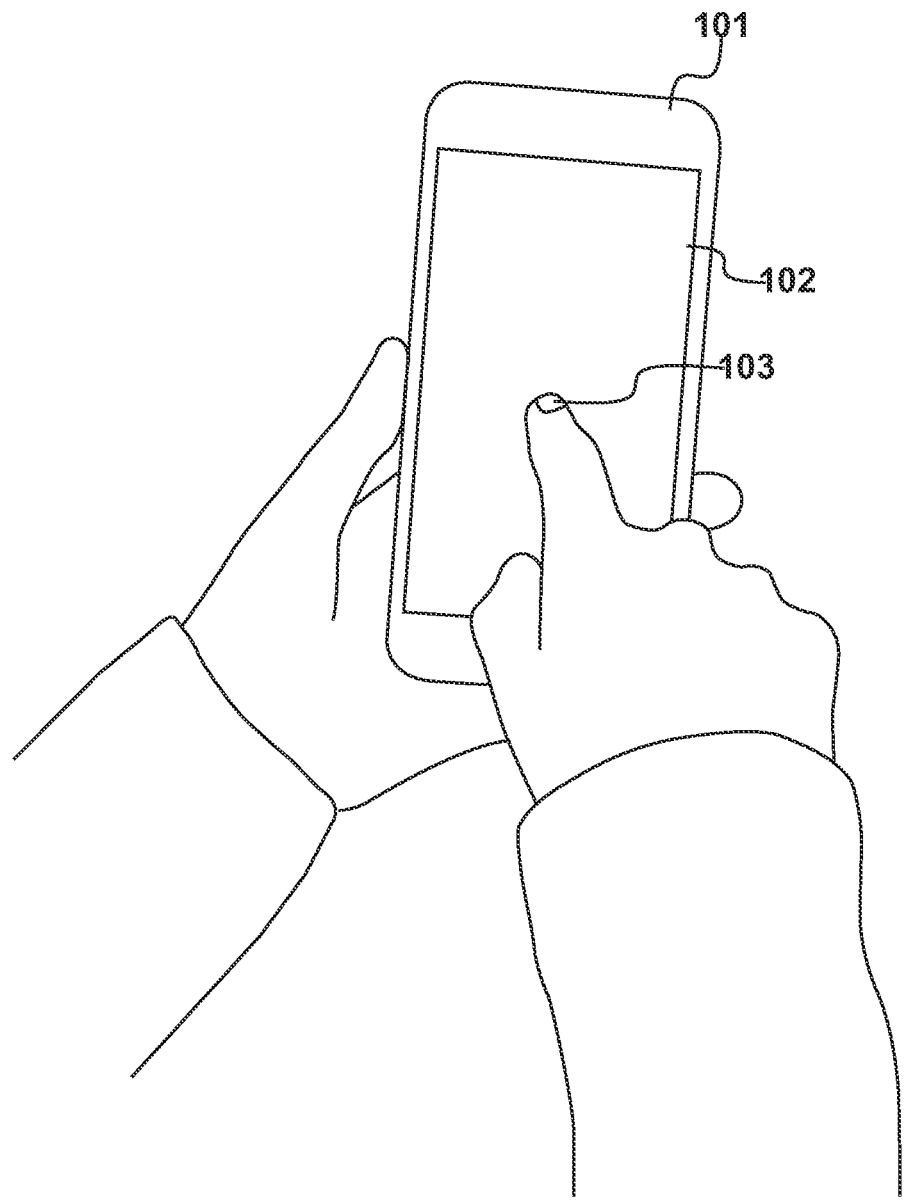
FIG. 1 shows an electronic device for utilizing an apparatus for detecting mechanical interaction.

An example electronic device which utilizes an apparatus for detecting a mechanical interaction, such as a matrix array sensor is depicted in FIG. 1. Electronic device 101 includes a touch screen 102 which is responsive to a mechanical interaction such as a finger press 103. Finger press 103 is configured to activate a response from a sensing array in touch screen 102 such that selections can be made by a user to enable electronic device 101 to perform any required tasks. Typically, such sensing arrays are able to determine location and/or extent properties based on the mechanical interaction and respond accordingly.

FIG. 2

Figure 2:
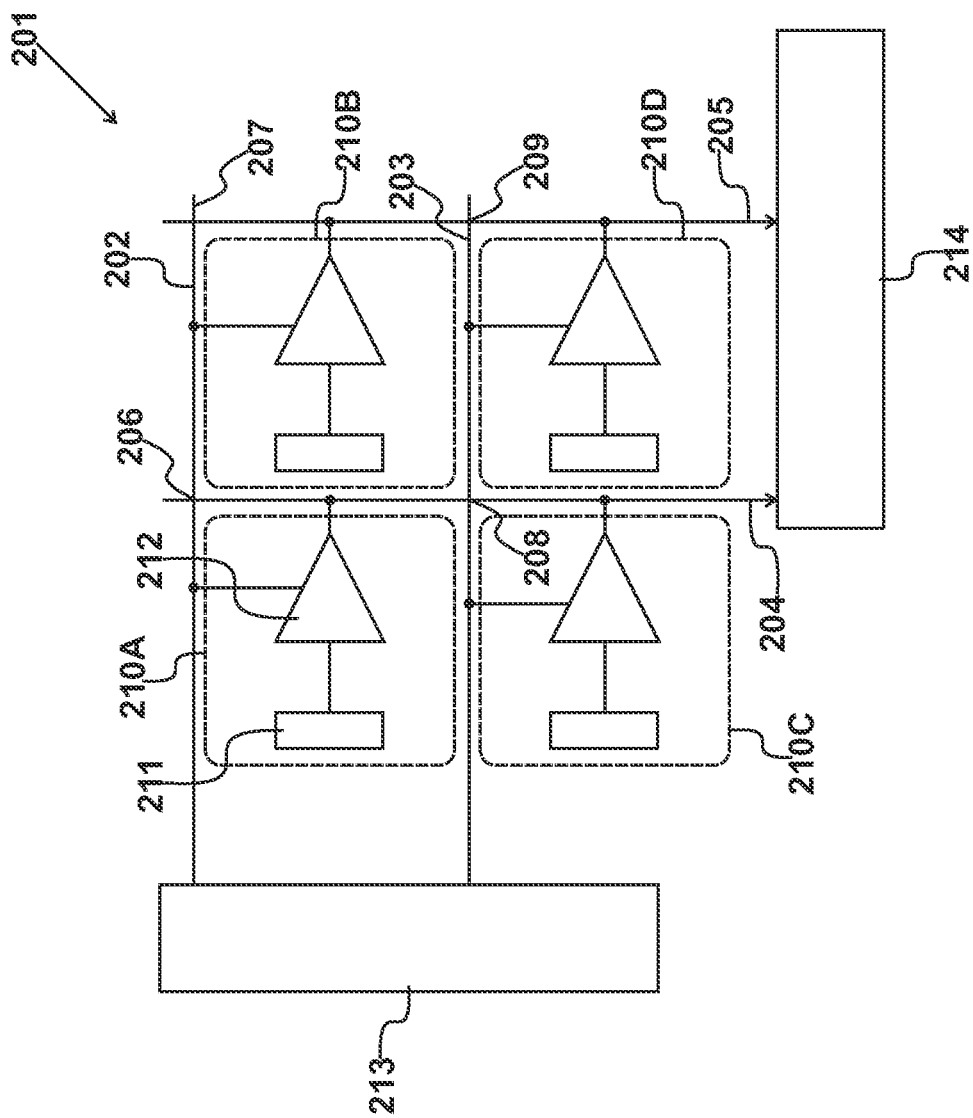
FIG. 2 shows an apparatus for detecting a mechanical interaction.

An apparatus for detecting a mechanical interaction is shown in a simplified diagrammatic form in FIG. 2. Apparatus 201 comprises a plurality of scan lines 202 and 203 and a plurality of output lines 204 and 205. In the example, each output line intersects with at least one scan line to form an intersection, and each scan line consequently intersects with at least one output line. For example, scan line 202 intersects with output line 204 at an intersection 206 and output line 205 at an intersection 207. Similarly, scan line 203 intersects output lines 204 and 205 respectively at intersections 208 and 209.

Apparatus 201 further comprises a plurality of sensing elements 210A, 210B, 210C and 210D. Each of the sensing elements comprises a variable resistance element and a voltage amplifier. In particular, sensing element 210A comprises a variable resistance element 211 and voltage amplifier 212. It is appreciated that the remaining sensing elements 210B, 210C and 210D also include their own variable resistance elements and voltage amplifiers.

Apparatus 201 further comprises a driving processor 213 which is configured to activate any one of the plurality of scan lines as required and an output processor 214 which is configured to determine a voltage output from each said output line from the plurality of sensing elements.

In use, the driving processor 213 activates any one of the scan lines and further activates the sensing element. The output processor is then able to determine the voltage output from the output lines. This process will be described in further detail with respect to FIGS. 7 to 9.

FIG. 3

Figures 3A, 3B:
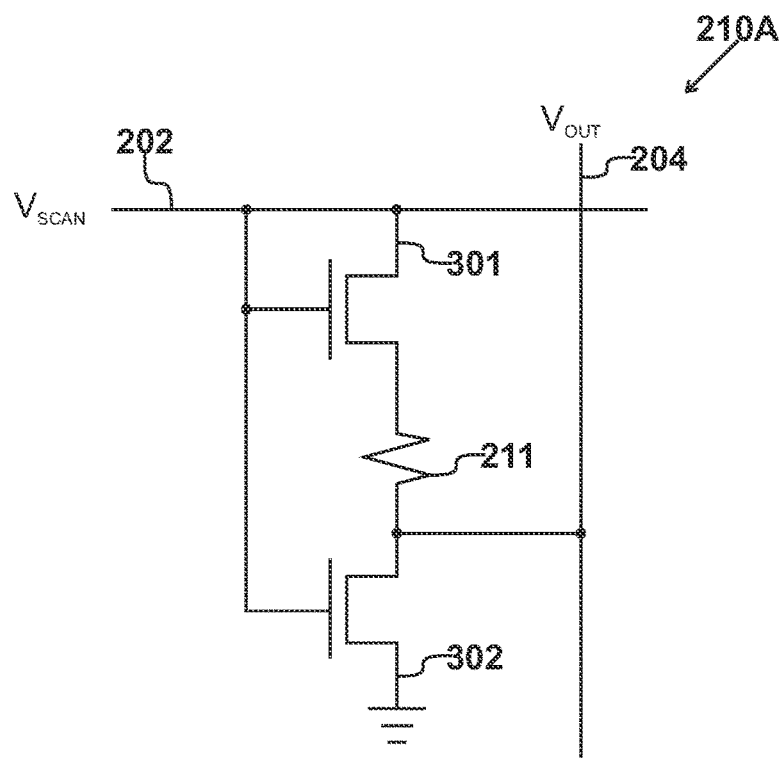
FIG. 3 shows an electric circuit and an equation in accordance with the present invention.

An example embodiment forming part of the invention will now be described with respect to FIGS. 3A and 3B. FIG. 3A shows a circuit diagram of the sensing element 210A and its corresponding scan line 202 and output line 204.

Sensing element 210A comprises first transistor 301 and a second transistor 302 which are arranged in series with each other. First and second transistors 301 and 302 combine to act as voltage amplifier 212 in the arrangement. Variable resistance element 211 is arranged in series with the transistors in a manner so as to block a flow of current through variable resistance element 211 as necessary. When blocked, and the voltage amplifier is considered off, the output impedance from the voltage amplifier is relatively high. In an embodiment, the output impedance is at least $1 \times 10^9$ ohms.

The source of transistor 301 is connected to the drain of transistor 302 via the variable resistive element 211 with the gates of each transistor being configured to receive input voltage $V_{SCAN}$ via scan line 202. Transistor 302 is grounded at its source. In the embodiment, transistors 301 and 302 are n-type or nMOS transistors as shown.

Variable resistance element 211 has a variable resistance $R_{211}$ and comprises a pressure sensitive material. In an embodiment, the pressure sensitive material is a quantum tunneling material such as that sold by the present applicant under the brand name QTC®. In particular, this material is such that under an applied force or pressure, the resistance in the material varies. For example, with a higher pressure, the quantum tunneling material exhibits a reduction in electrical resistance.

In use, an input voltage $V_{SCAN}$ is transmitted via scan line 202 to the gates of each transistor 301 and 302. The output voltage $V_{OUT}$ at output line 204 from the sensing element 210A can be calculated in accordance with the equation 303 shown in FIG. 3B. This voltage output $V_{OUT}$ is affected by the variations in resistance of the variable resistance element. On transmission of the input voltage $V_{SCAN}$, transistor 301 and 302 are activated and the voltage amplifier is considered to be switched on and conducting current. The arrangement acts as a resistive divider and thus the output voltage can be calculated from the input voltage multiplied by the ratio of the drain-source resistance $R_{302}$ of the transistor 302 to the sum of the drain-source resistances $R_{301}$, $R_{302}$ of both transistors 301, 302 and the resistance $R_{211}$ of the variable resistance element 211.

This relationship enables the sensing element 210A to be tailored for different applications. To achieve a high sensitivity voltage output from the sensing element, the drain-source resistance of transistor 302 needs to be large compared to the sum of the denominator of equation 303. This is achieved by ensuring that transistor 301 has a relatively large width to length ratio compared to transistor 302. The smaller width to length ratio of transistor 302 therefore results in a larger drain-source resistance $R_{302}$. This relationship is illustrated further with respect to FIGS. 4 and 5.

In further embodiments, first and second transistors have substantially similar width to length ratios so as to produce appropriate variations in relation to the sensitivity and output voltage as required.

FIG. 4

Figure 4:
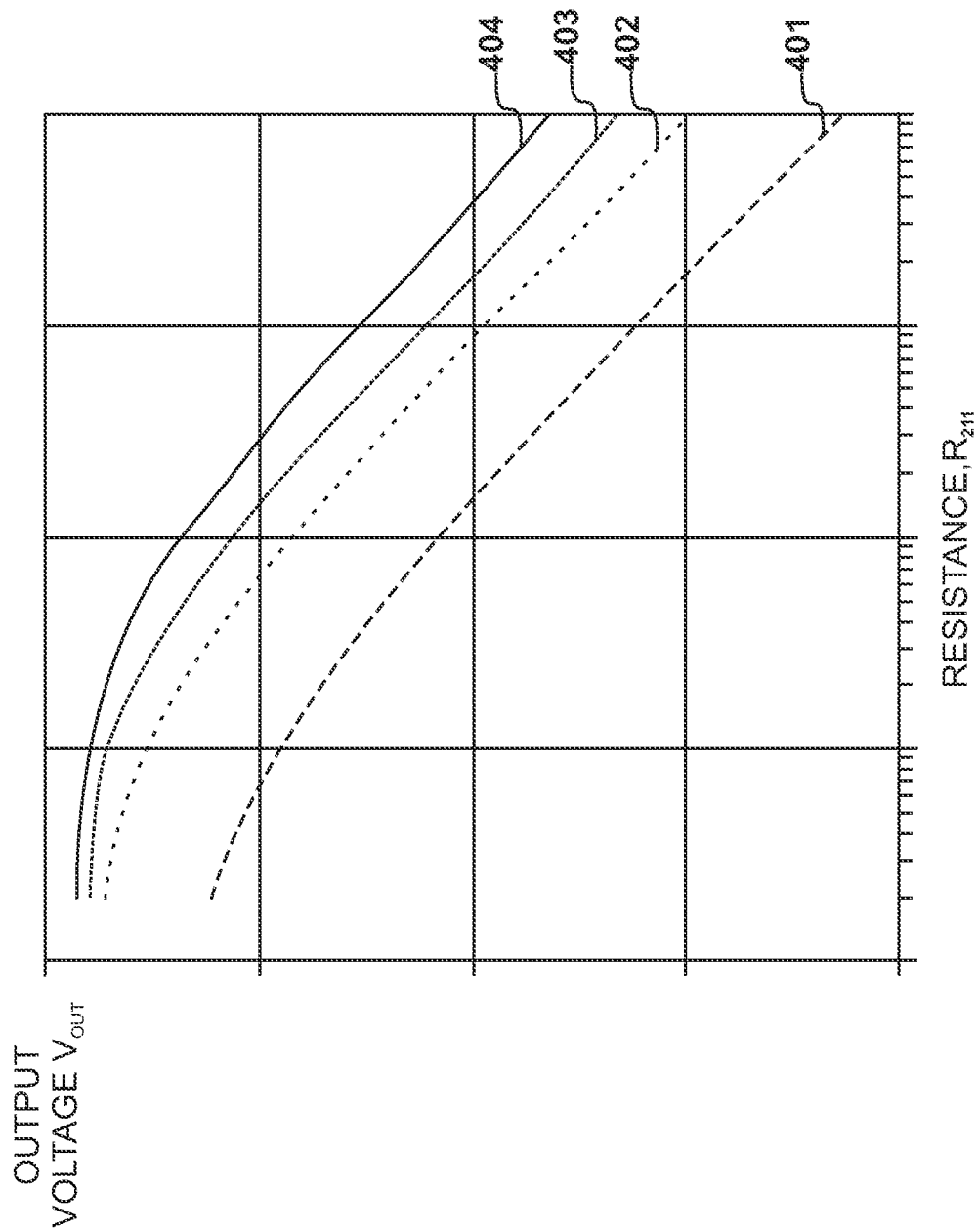
FIG. 4 shows a graphical representation of the relationship between the output voltage against resistance of the electric circuit of FIG. 3.

A graphical representation in logarithmic form of the relationship between the output voltage $V_{OUT}$ against the resistance of the variable resistance element $R_{211}$ of the arrangement of FIG. 3 is illustrated in FIG. 4 for different width/length ratios.

In the example, the width to length ratio of the first transistor 301 is calculated as the ratio of a constant multiplied by a given width to a given length. The width to length ratio of the second transistor 302 is calculated as the ratio of a given width to the same constant multiplied by a given length. This ensures that the width to length ratio of transistor 302 is small in comparison to the width to length ratio of transistor 301. The constant is varied to provide an indication of results for different sizes.

Line graphs 401, 402, 403 and 404 show the results for increasing values of the constant. For example, in test results, the constant value was identified as 1 for graph 401, 5 for graph 402, 10 for graph 403 and 20 for graph 404.

The graph illustrates that the output voltage varies non-linearly across the voltage range. For an increase in the value of the constant, the output voltage increases such that there is a larger output voltage for graph 404. Furthermore, the sensitivity of the arrangement is reduced for higher applied pressures, and consequently higher resistances of the variable resistance element.

FIG. 5

Figure 5:
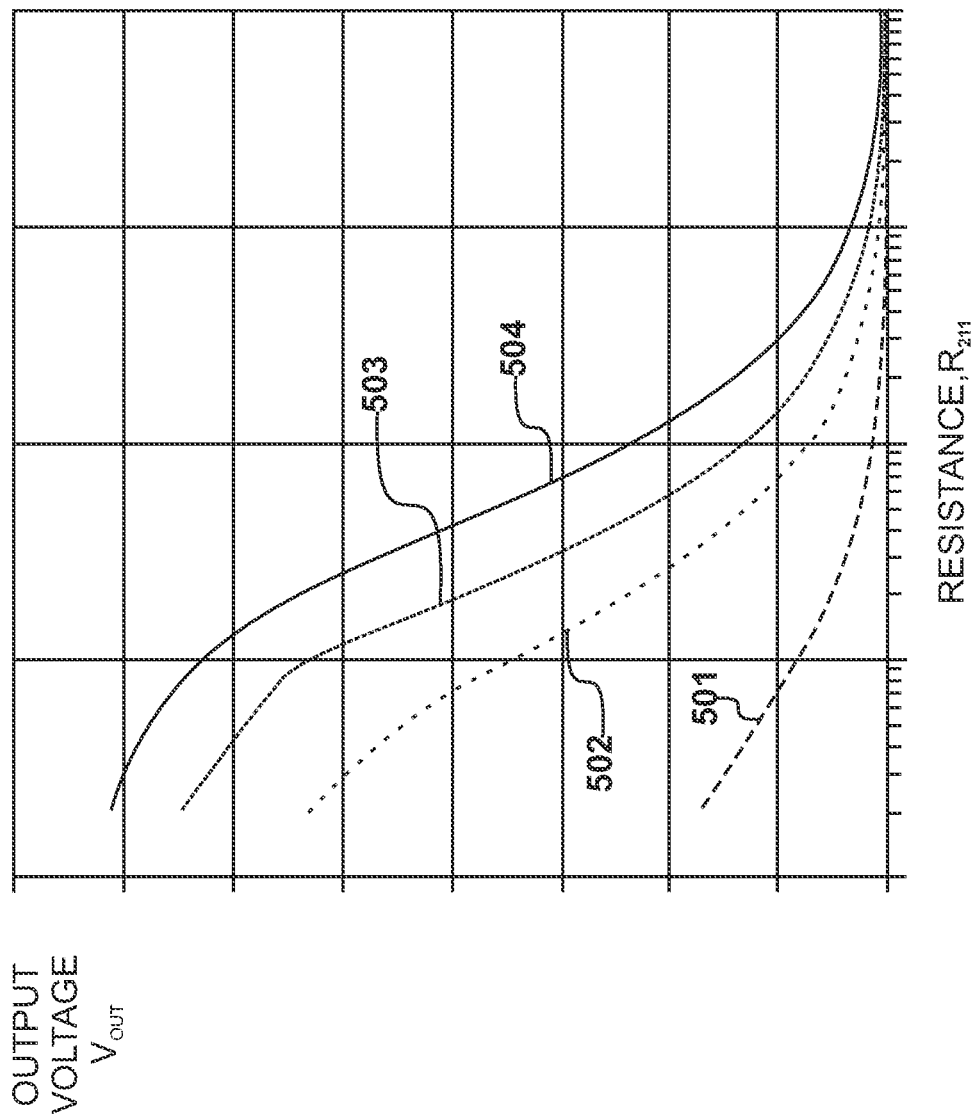
FIG. 5 shows a further graphical representation of the relationship between the output voltage against resistance of the circuit of FIG. 3.

A graphical representation of the relationship between the output voltage $V_{OUT}$ against the resistance of the variable resistance element $R_{211}$ in linear form is shown in FIG. 5 in line with the results shown in FIG. 4.

Line graphs 501, 502, 503 and 504 correspond to line graphs 401, 402, 403 and 404 respectively. This highlights the variation in output voltage and the loss in sensitivity at higher resistances and input pressures for a single sensing element as in the case of the simplified embodiment of FIG. 3. It is particularly noted that at high resistances, whereby a lower input voltage is provided and the sensing element is in a high-impedance state, the output voltage is also low which leads to the loss in sensitivity.

FIG. 6

Figure 6:
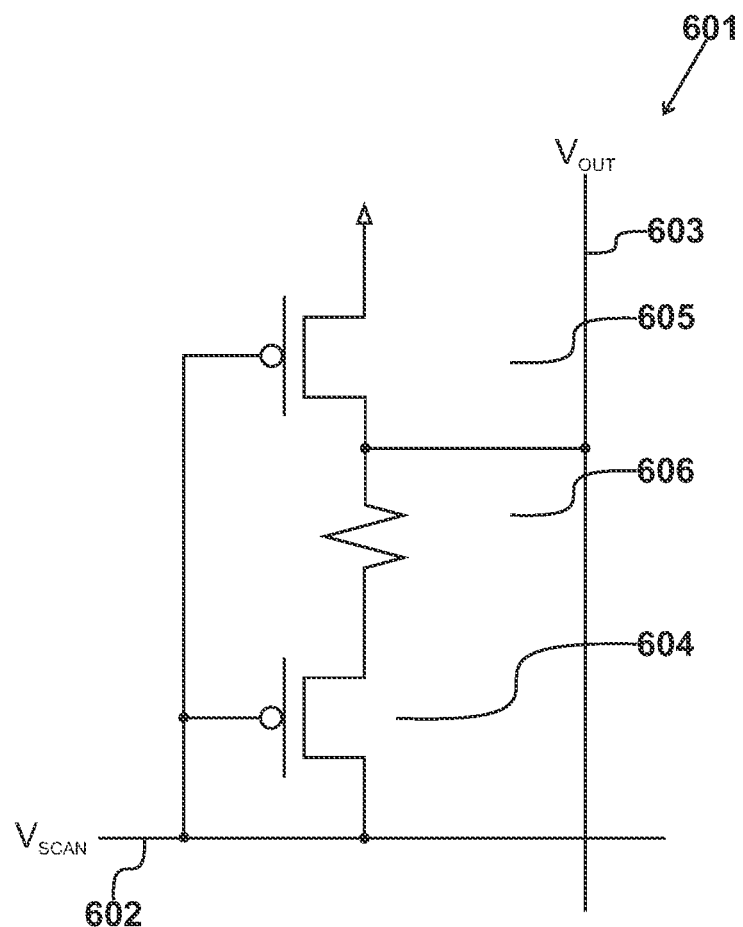
FIG. 6 shows an alternative electric circuit to the embodiment of FIG. 3.

An alternative embodiment to the example illustrated in respect of FIG. 3 is shown in FIG. 6. The circuit diagram of FIG. 6 illustrates an alternative sensing element 601 which can be utilized which operates with p-type or pMOS transistors.

Sensing element 601 forms part of a substantially similar apparatus to previously described apparatus 201 and includes a plurality of scan lines including scan line 602, and a plurality of output line, including output line 603.

Sensing element 601 comprises first transistor 604 and a second transistor 605 which are arranged in series with each other. As previously, first and second transistors 604 and 605 combine to act as a voltage amplifier in the arrangement. Variable resistance element 606 is arranged in series with the transistors in a manner so as to block a flow of current through variable resistance element 606 as necessary. When blocked, and the voltage amplifier is considered off, the output impedance from the voltage amplifier is relatively high. In an embodiment, the output impedance is at least $1 \times 10^9$ ohms.

The source of transistor 604 is connected to the drain of transistor 605 via the variable resistive element 606 with the gates of each transistor being configured to receive input voltage $V_{SCAN}$ via scan line 602. In the embodiment, transistors 604 and 606 are p-type or pMOS transistors as shown.

Variable resistance element 606 has a resistance $R_{606}$ and comprises a pressure sensitive material. In an embodiment, the pressure sensitive material is a quantum tunneling material such as that sold by the present applicant under the brand name QTC®.

In use, an input voltage $V_{SCAN}$ is transmitted via scan line 602 to the gates of each transistor 604 and 605. The output voltage $V_{OUT}$ at output line 603 from sensing element 601 can be calculated in a similar manner to that of FIG. 3.

Thus, the arrangement of FIG. 6 provides an alternative to the arrangement of FIG. 3 and is utilized in a substantially similar manner. It is appreciated that alternative circuit arrangements may also be used in further embodiments to provide suitable outputs and sensitivity variations as required.

FIG. 7

Figure 7:
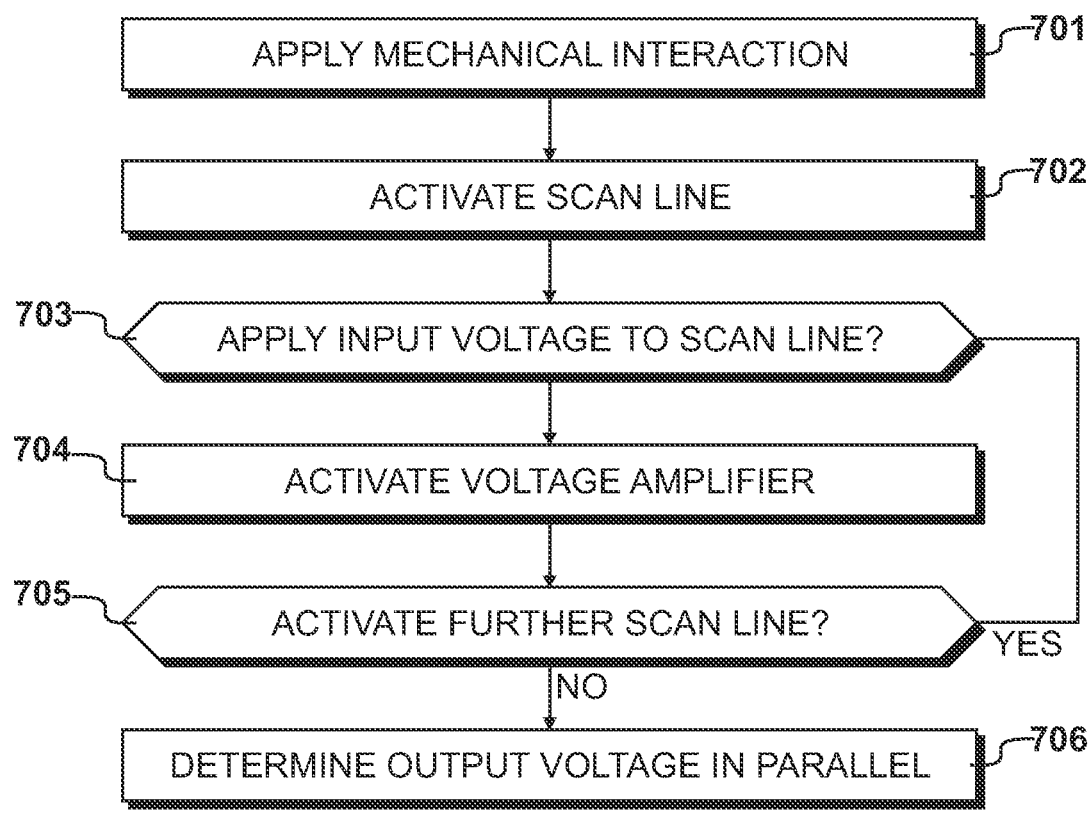
FIG. 7 shows a method of detecting a mechanical interaction in a sensing array.

A method of detecting a mechanical interaction in a sensing array will now be described with respect to FIG. 7 which shows a flow diagram illustrating the method.

In order to activate the apparatus as previously described, a mechanical interaction is applied by a user at step 701, for example a finger press in the manner indicated in FIG. 1.

A scan line in the sensing array is activated by a driving processor at step 702. An input voltage is applied to the plurality of scan lines forming the sensing array at step 703 thereby providing power and activation to a voltage amplifier at step 704, along with providing power to the variable resistive element of the sensing element.

Once activated, current is permitted to flow through the variable resistive element, and consequently, it is appreciated that, when inactive, the flow of current through the variable resistive element is blocked by the voltage amplifier (or specifically, the transistors forming the voltage amplifier).

In operation, voltage outputs from the sensing array are determined in parallel by an output processor. Each scan line is therefore activated sequentially and thus, at step 705, a question is asked if a further scan line is required to be activated. If this question is answered in the affirmative, a further input voltage is applied to the next scan line, with the next voltage amplifier corresponding to that scan line being activated so that an output voltage can be determined. This cycle can be repeated for any number of rows of the sensing array. It is appreciated that, in alternative embodiments, the entire array is not scanned and the processor can be set to scan part of the array, rather than the whole array. Furthermore, in a still further embodiment, the array is not scanned sequentially and is instead scanned non-sequentially.

In any event, once all required scan lines have been activated and appropriate output voltage transmitted, the output voltage is determined in parallel at step 706.

FIG. 8

Figure 8:
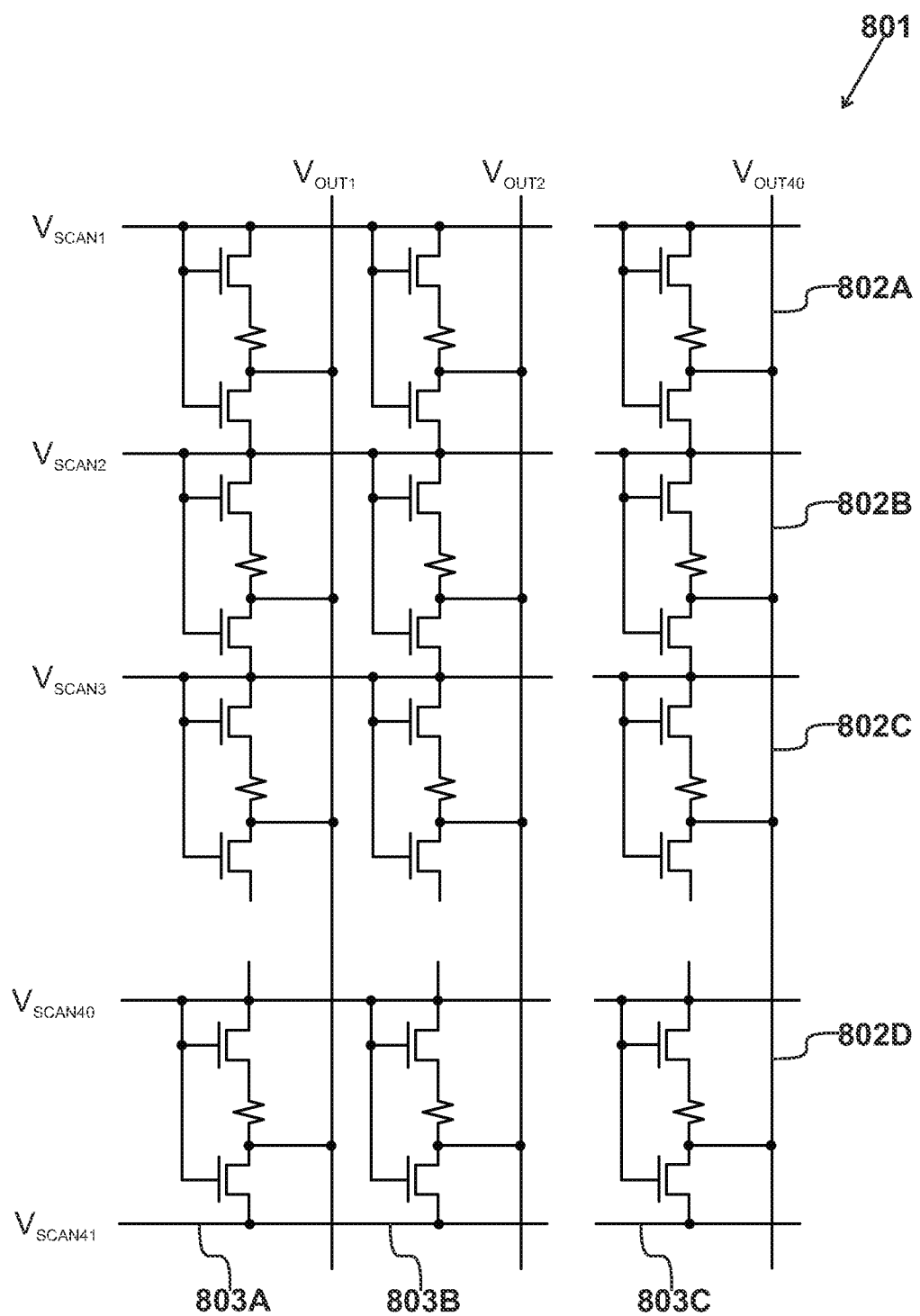
FIG. 8 shows a sensing array in accordance with the present invention.

An apparatus in accordance with the present invention showing a sensing array 801 is illustrated in FIG. 8. The embodiment of FIG. 8 shows a diagrammatic representation of a 40×40 array including 1600 sensing elements substantially similar to sensing element 210A of FIG. 3. In the drawing, only 12 of these sensing elements are shown for simplicity.

Each of the sensing elements comprises two transistors forming a voltage amplifier and a variable resistance element. Each variable resistance element comprises a pressure sensitive material such as a quantum tunneling material which exhibits variable resistance.

In the embodiment, the sensing elements form a plurality of rows 802 and a plurality of columns 803 which are fed an input voltage $V_{SCAN}$ via a plurality of scan lines and provide an output voltage via a plurality of output lines $V_{OUT}$. In the embodiment, the ground point of each row is shared with the scan line of the next row so as to reduce the complexity of the required circuitry. Scan line 804, which receives an input voltage $V_{SCAN41}$ is held at ground potential.

Given that each sensing element is held at a high impedance when inactive, this ensures that each sensing element in a given column only provides an output voltage when it has been activated by a mechanical interaction. In this way, the output voltage line is driven only by the active resistive divider of the activated row.

FIG. 9

Figure 9:
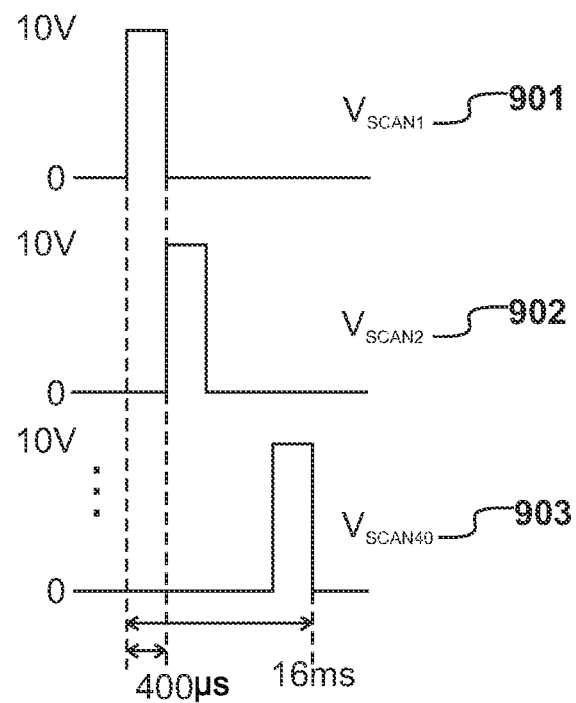
FIG. 9 shows a timing diagram utilized for scanning the sensing array of FIG. 8.

A timing diagram utilized for scanning the sensing array 801 is shown in FIG. 9. The timing diagram shown corresponds to a scanning frequency of sixty Hertz (60 Hz) and illustrates how each row of array 801 is scanned sequentially. At 901, an input voltage $V_{SCAN1}$ is applied for four hundred microseconds (400 µs) before a further input voltage $V_{SCAN2}$ is applied for a further four hundred microseconds (400 µs) at 902. This process is repeated until each row 802 has received an input voltage, ending with the application of input voltage $V_{SCAN40}$ for the final row at 903.

As noted previously, the resistance of each of the variable resistance elements affects the value of the output voltage $V_{OUT}$ and this can consequently be used to determine positional properties as required. Each output voltage is determined in parallel given that the inactive sensing elements have high impedance when they are switched off. The output voltage can be calculated in a substantially similar manner to that as described in respect of FIG. 3.

FIG. 10

Figure 10:
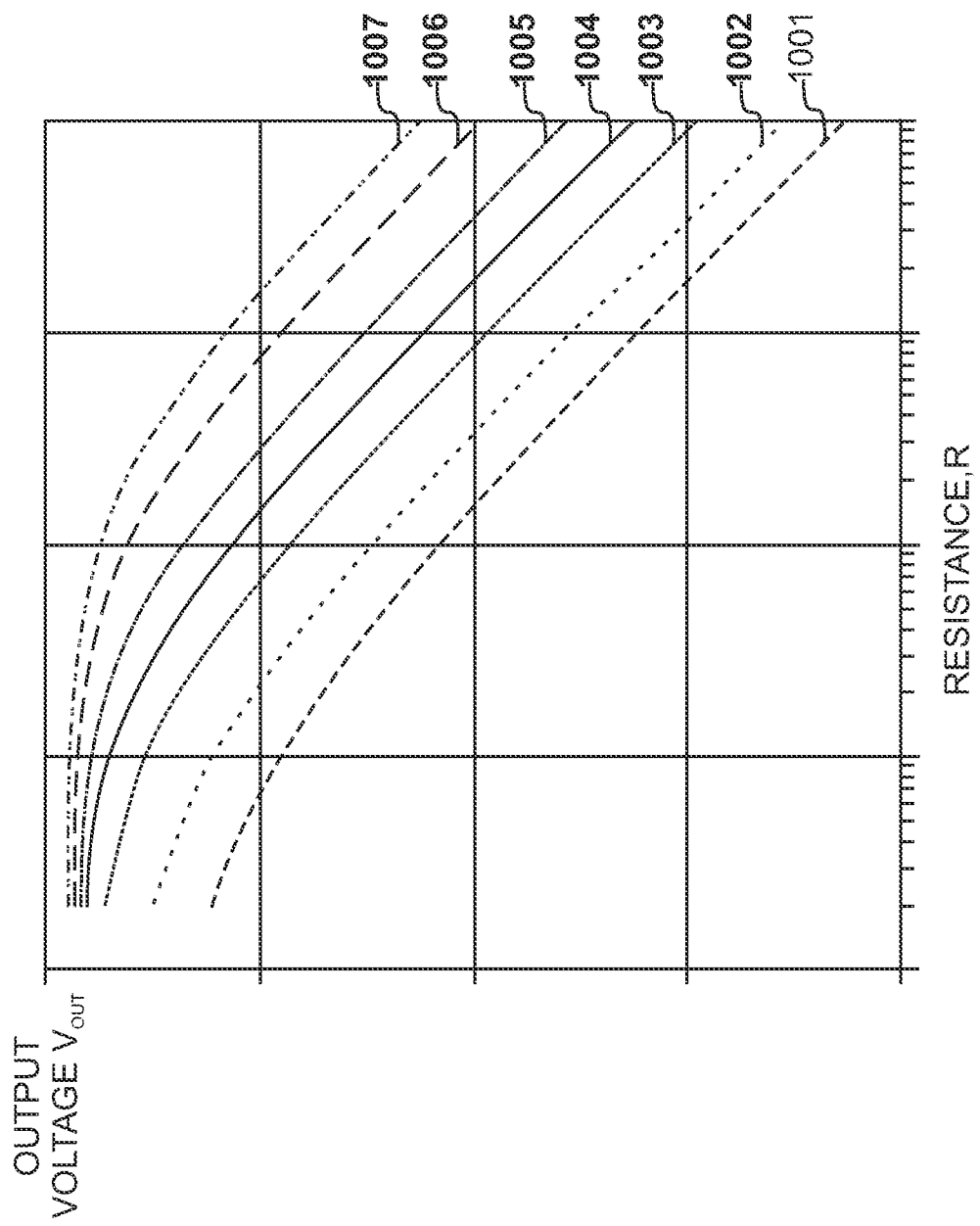
FIG. 10 shows a graphical representation of output voltage against resistance for the sensing array of FIG. 8.
Figure 11:
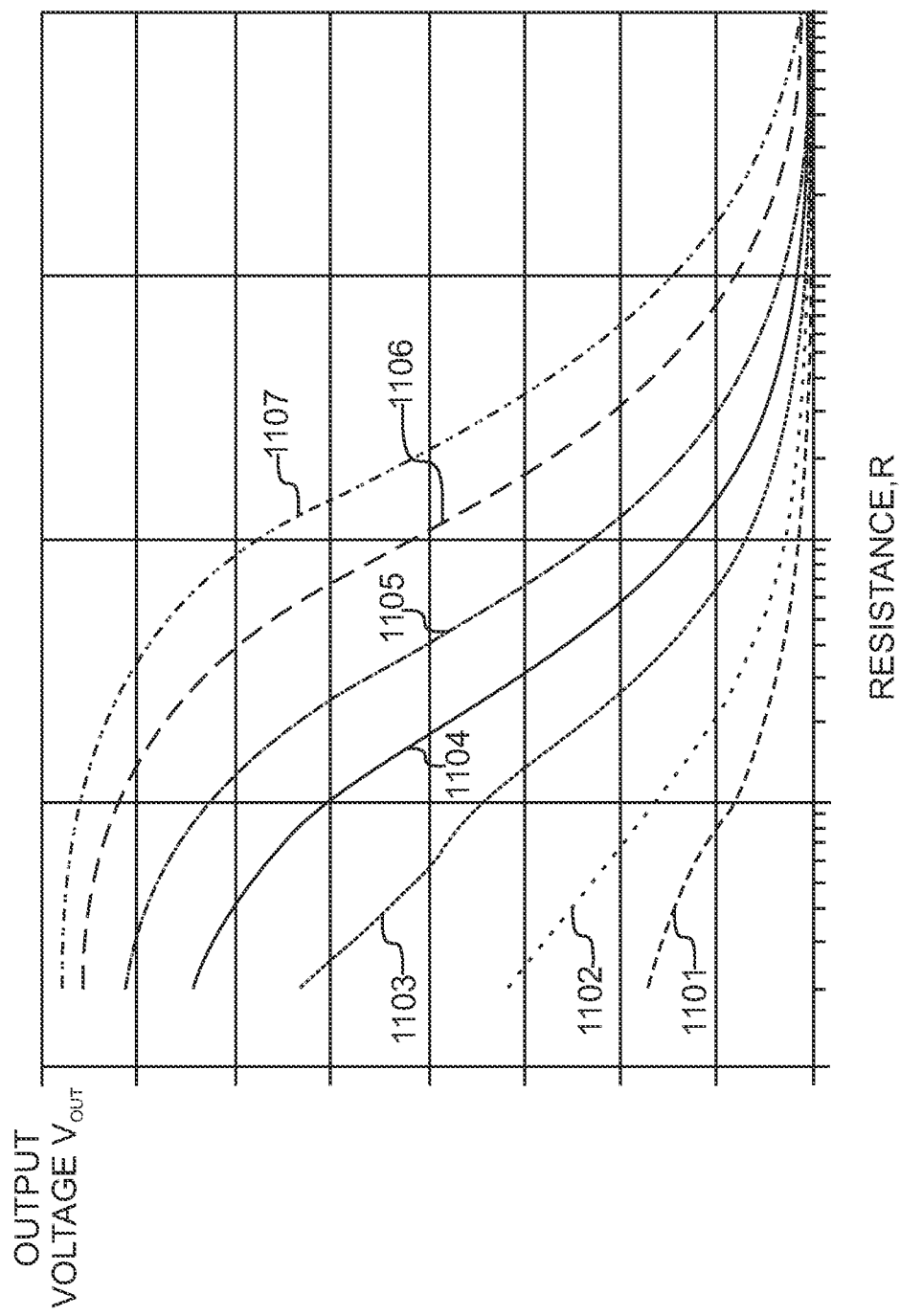
FIG. 11 shows a further graphical representation of output voltage against resistance for the sensing array of FIG. 8.

Corresponding line graphs for sensing array 801 for output voltage against the resistance of the variable resistance element are shown in FIGS. 10 and 11.

A graphical representation in logarithmic form of the relationship between the output voltage $V_{OUT}$ against the resistance of the variable resistance element R of the arrangement of FIG. 8 is illustrated in FIG. 10 for different width/length ratios of the transistors.

The width to length ratios of the transistors of the sensing array 801 are calculated in a substantially similar manner to the manner of FIGS. 4 and 5.

Line graphs 1001, 1002, 1003, 1004, 1005, 1006 and 1007 show the results for increasing values of a similar constant. In this example, the constant value is identified as 1 for graph 1001, 2 for graph 1002, 5 for graph 1003, 10 for graph 1004, 20 for graph 1005, 50 for graph 1006 and 100 for graph 1007.

The graph again illustrates that the output voltage varies non-linearly across the voltage range. For an increase in the value of the constant, the output voltage increases such that there is a larger output voltage for graph 1007. Furthermore, the sensitivity of the arrangement is reduced for higher applied pressures, and consequently higher resistances of the variable resistance element.

FIG. 11

A graphical representation of the relationship between the output voltage $V_{OUT}$ against the resistance of the variable resistance element R in linear form is shown in FIG. 11 in line with the results shown in FIG. 10.

Line graphs 1101, 1102, 1103, 1104, 1105, 1106 and 1107 correspond to line graphs 1001, 1002, 1003, 1004, 1005, 1006 and 1007 respectively. This highlights the variation in output voltage and the loss in sensitivity at higher resistances and input pressures. It is particularly noted that at high resistances, whereby a lower input voltage is provided and the sensing element is in a high-impedance state, the output voltage is also low which leads to the loss in sensitivity.

Graph 1007 is considered to give an unrealistic measure for the width to length ratios (with first and second transistors having width to length ratios of 1000/10 and 10/1000 respectively), as, as noted in respect of FIG. 11 in particular, the output voltage takes longer to reach a steady state with increase in the constant. In this particular example, the output voltage does not reach steady state in the manner of more consistent width to length ratios it is therefore preferred to have a width to length ratio at a lower range.

FIG. 12

Figure 12:
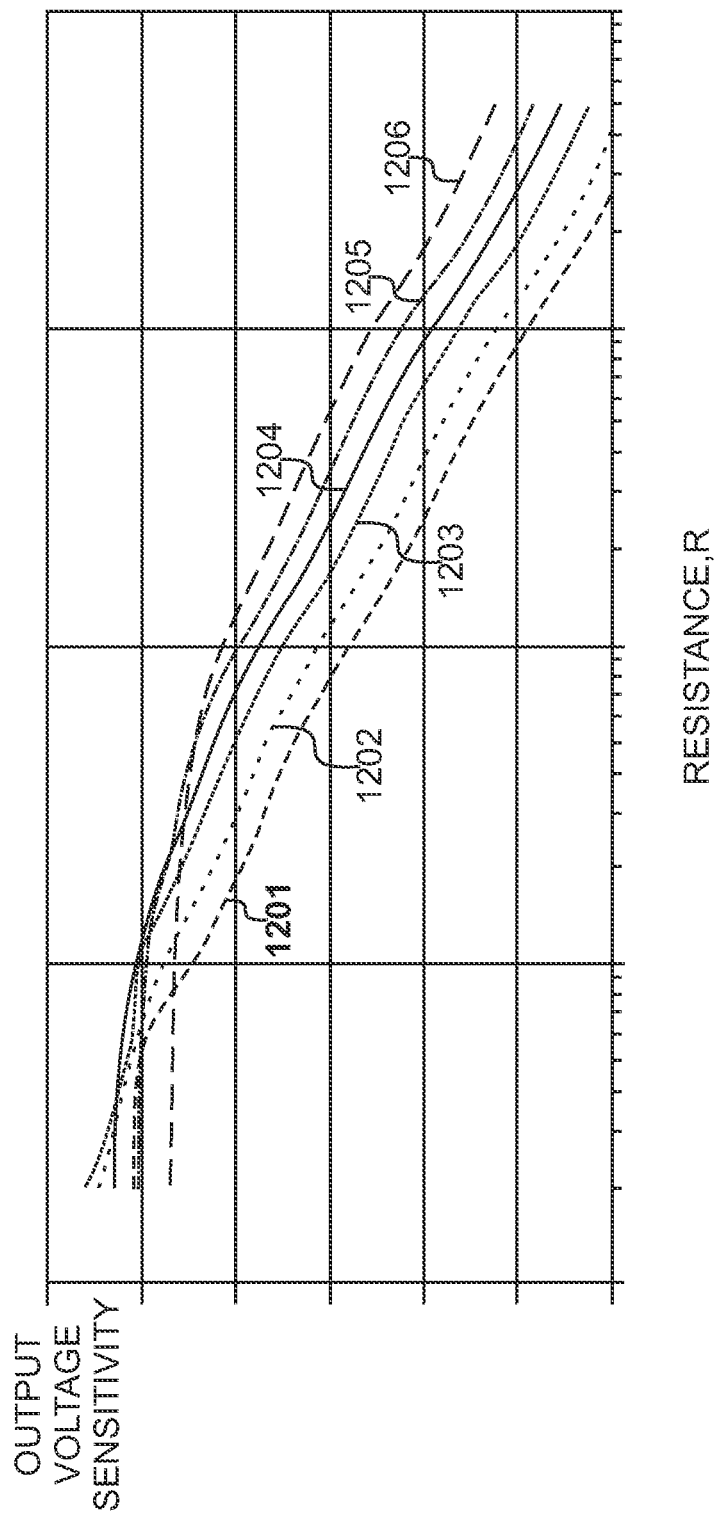
FIG. 12 shows a graphical representation of output voltage sensitivity against resistance.

A graphical representation of the variation of the output voltage sensitivity to the resistance of the variable resistance element is shown in FIG. 12. The output voltage sensitivity is calculated as a ratio of the output voltage to the resistance of the variable resistance element.

The graph again shows various line graphs for alternative values of width to length ratios with each of the line graphs 1201, 1202, 1203, 1204, 1205 and 1206 relating to higher values of the constant.

What is noted from FIG. 12 is that for a large constant, such as line graph 1206, the sensing element shows a high sensitivity at low pressure or with increased resistance of the variable resistance element. Correspondingly, when a low constant is used to design the sensing elements and affect the width to length ratios of the voltage amplifiers, such as illustrated by line graph 1201, at high pressures (and low resistance of the variable resistance element), there is higher sensitivity and at low pressures there is a reduced sensitivity.

FIG. 13

In the embodiment previously shown in FIG. 8, it is possible to ensure that each sensing element in the array is sized substantially similarly in that each of the width to length ratios and the constant parameter are the same to give similar outputs. However, in an alternative embodiment, the sensitivity variation illustrated in FIG. 12 allows for an alternative embodiment, whereby sensing elements can be provided with different width to length ratios (by varying the value of the constant). Thus, it is possible to have a number of sensing elements having a particular value to provide a certain output voltage variation, and a number of sensing elements having an alternative value to provide a different output voltage variation.

Figure 13:
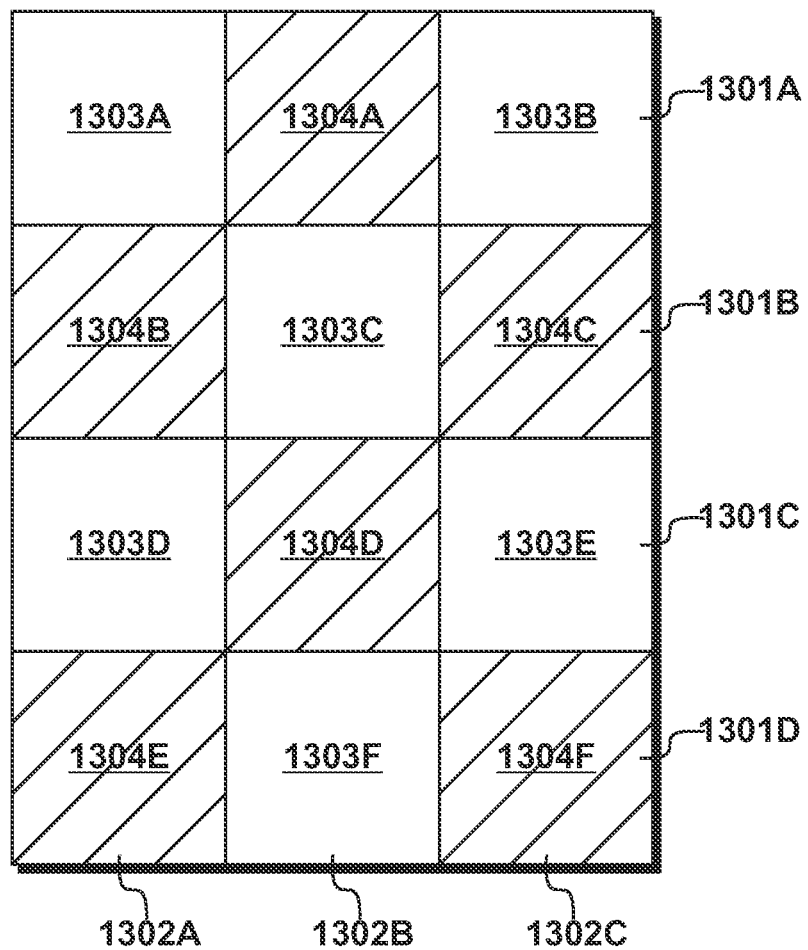
FIG. 13 shows a diagrammatic representation of a sensing array having variable sensitivities.
Figure 14:
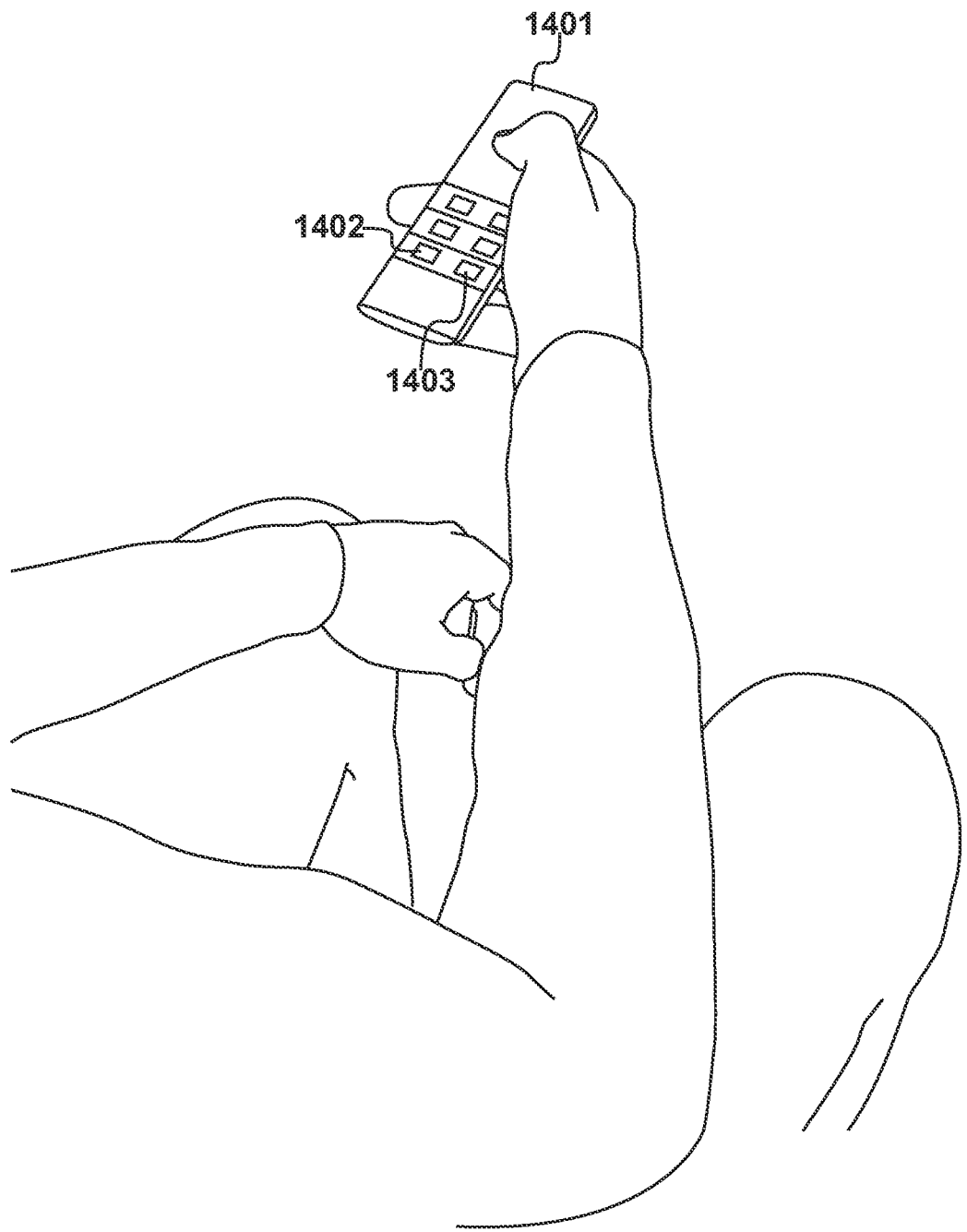
FIG. 14 shows an example application of a sensing array arranged in the manner of FIG. 13.

A diagrammatic example of such an array is illustrated in FIG. 13. For simplified purposes, a sensing array having four rows 1301 and three columns 1302 is shown. In the embodiment, a plurality of sensing elements 1303 have been sized to include transistors having particular width to length ratios based on a first constant value. Thus, the first transistor in these sensing elements would have a value of its width to length ratio multiplied by a first constant and the second transistor in these sensing elements would have a value of its width to length ratio multiplied by the inverse of the first constant.

In contrast, a further plurality of sensing elements 1304 have been sized to include transistors having particular width to length ratios based on a second constant value. Thus, the first transistor in these sensing elements would have a value of its width to length ratio multiplied by a second constant and the second transistor in these sensing elements would have a value of its width to length ratio multiplied by the inverse of the second constant.

Thus, in this way, the plurality of sensing elements 1303 each have a first sensitivity and the plurality of sensing elements 1304 each have a second sensitivity. This means that each plurality of sensing elements can be configured to have a particular property to include the flexibility of the sensing array.

For example, in an embodiment, the first plurality of sensing elements can be sensitive primarily to low forces, and the second plurality of sensing elements can be sensitive primarily to high forces to give a variation across a sensing array. This can effectively extend the dynamic range of the array.

FIG. 14

An example application of a sensing array arranged in the manner of FIG. 13 is shown whereby a user is able to operate an electronic device 1401. In the embodiment, the electronic device 1401 is a remote control.

Electronic device 1401 comprises a plurality of input devices in the form of buttons. In this illustrated example, button 1402 is configured to respond to a high force and button 1403 is configured to response to a low force. Thus, the variable sensitivity of the sensing array forming part of the electronic device provides input devices requiring various input forces.

The invention claimed is:

1. Apparatus for detecting a mechanical interaction, comprising:
    a plurality of scan lines and a plurality of output lines;
    each output line of said plurality of output lines intersecting with at least one scan line of said plurality of scan lines to form an intersection, each said intersection providing a connection to a sensing element;
    each said sensing element comprising a variable resistance element responsive to said mechanical interaction, a first transistor, and a second transistor; and
    an output processor configured to determine a voltage output in parallel at each said output line from said plurality of sensing elements on activation of one said scan line from a driving processor; wherein:
    said first transistor is arranged in series with said second transistor to act as a voltage amplifier and said first transistor and said second transistor are both arranged in series with said variable resistance element to allow a flow of current through said variable resistance element to be blocked such that an output voltage from an activated sensing element is amplified; and
    said driving processor is configured to activate each said scan line sequentially.

2. Apparatus according to claim 1, wherein said first transistor has a width to length ratio which is the same as a width to length ratio of said second transistor.

3. Apparatus according to claim 1, wherein said first transistor and said second transistor are both n-type transistors or said first transistor and said second transistor are both p-type transistors, and further wherein, said first transistor has a width to length ratio which is larger than a width to length ratio of said second transistor.

4. Apparatus according to claim 1, wherein said first transistor is arranged such that a source of said first transistor is connected to a drain of said second transistor via said variable resistance element.

5. Apparatus according to claim 1, wherein a gate of said first transistor and a gate of said second transistor are configured to receive an input voltage applied to a corresponding scan line of said plurality of scan lines.

6. Apparatus according to claim 5, wherein said input voltage is configured to activate said first transistor, said second transistor, and said variable resistance element.

7. Apparatus according to claim 1, wherein said variable resistance element comprises a pressure sensitive material which, under an applied pressure, the resistance in said pressure sensitive material varies.

8. Apparatus according to claim 7, wherein said pressure sensitive material is a quantum tunneling material.

9. Apparatus according to claim 1, wherein said plurality of sensing elements comprises a first plurality of sensing elements having a first sensitivity and a second plurality of sensing elements having a second sensitivity.

10. A method of detecting a mechanical interaction in a sensing array, comprising the steps of:
- activating a scan line in said sensing array comprising a plurality of scan lines, a plurality of output lines, and a plurality of sensing elements comprising a variable resistance element responsive to said mechanical interaction, a first transistor, and a second transistor;
- applying an input voltage to said plurality of scan lines;
- determining an output voltage in parallel at each output line of said plurality of output lines from said plurality of sensing elements;
- blocking a flow of current though each said variable resistive element by means of said first transistor and said second transistor, said first transistor arranged in series with said second transistor and said first transistor and said second transistor both arranged in series with said variable resistive element, when said corresponding scan line is inactivated such that an output voltage from an activated sensing element is amplified; and
- activating said scan line sequentially when activating said plurality of scan lines.

11. A method according to claim 10, wherein said step of applying an input voltage comprises activating at least one said first transistor or said second transistor to provide said output voltage.

12. A method according to claim 10, wherein said step of applying an input voltage activates said first transistor, said second transistor, and said variable resistance element of the activated scan line.

13. A method according to claim 10, wherein said output voltage is provided from at least one sensing element of said plurality of sensing elements by means of said mechanical interaction in said sensing array.

* * * * *